United States Patent [19]

Orvek

[11] Patent Number: 5,356,758
[45] Date of Patent: Oct. 18, 1994

[54] METHOD AND APPARATUS FOR POSITIVELY PATTERNING A SURFACE-SENSITIVE RESIST ON A SEMICONDUCTOR WAFER

[75] Inventor: Kevin J. Orvek, Plano, Tex.

[73] Assignee: Texas Instruments Incorporated, Dallas, Tex.

[21] Appl. No.: 823,086

[22] Filed: Jan. 15, 1992

Related U.S. Application Data

[63] Continuation of Ser. No. 569,250, Aug. 15, 1990, abandoned, which is a continuation of Ser. No. 290,946, Dec. 28, 1988, abandoned.

[51] Int. Cl.$^5$ .............................................. G03C 5/16
[52] U.S. Cl. ................................. 430/322; 430/313; 430/326; 430/330
[58] Field of Search ............... 430/190, 313, 330, 326, 430/322

[56] References Cited

U.S. PATENT DOCUMENTS

| | | | |
|---|---|---|---|
| 3,046,120 | 7/1962 | Schmidt et al. | 430/190 |
| 4,613,398 | 9/1986 | Chiong et al. | 156/628 |
| 4,749,436 | 6/1988 | Minato et al. | 430/330 |
| 4,804,612 | 2/1989 | Asaumi et al. | 430/328 |

FOREIGN PATENT DOCUMENTS 0248779 12/1987 European Pat. Off. .

OTHER PUBLICATIONS

Semiconductor International, Apr. 1987, pp. 84-91.
*Deep UV Stabilization of Photoresist: A Unified Chemical Description of Process and Parameters*; IBM Corporation; Klymdo, Klymdo, and Thayer.

*Primary Examiner*—Thorl Chea
*Attorney, Agent, or Firm*—Jacqueline J. Garner; Richard L. Donaldson; William E. Hiller

[57] ABSTRACT

A silicon semiconductor wafer (64) is processed within a container (62) to form a positive photolithographic image thereon. The wafer is coated with a phenol-containing resin photoresist (76). The photoresist (76) is exposed to deep ultraviolet light (84) through a reticle (82) to form exposed areas (90 and 92). HMDS (94) is then diffused into the resist (76) everywhere except the exposed areas (90 and 92) which are protected by cross-linked phenol molecules. The HMDS (94) forms silicon bonds with the diffused areas (94) which are thus prevented from being etched by an oxygen reactive ion etch. The exposed areas (90 and 92) are not similarly protected and recessed areas (102 and 104) are formed. Subsequent deposition or etching may then be conducted on the substrate (74) in the recessed areas (102 and 104).

4 Claims, 2 Drawing Sheets

METHOD AND APPARATUS FOR POSITIVELY PATTERNING A SURFACE-SENSITIVE RESIST ON A SEMICONDUCTOR WAFER

RELATED APPLICATIONS

This application is a continuation of application Ser. No. 07/569,250, filed Aug. 15, 1990, now abandoned, which is a continuation of application Ser. No. 07/290,946, filed Dec. 28, 1988 entitled "Method and Apparatus for Positively Patterning a Surface-Sensitive Resist on a Semiconductor Wafer" by Kevin James Orvek, now abandoned.

TECHNICAL FIELD OF THE INVENTION

This invention relates in general to semiconductor photolithographic processing, and in particular to a method and apparatus for positively patterning a surface-sensitive resist.

BACKGROUND OF THE INVENTION

To pattern a semiconductor wafer to form integrated circuits thereon, it is generally necessary to use photolithographic techniques. Photolithography requires the use of a light source and a photoresist that is sensitive to the light source. In conventional positive photolithographic patterning, a photoresist is applied to the semiconductor surface and then exposed to a light source through a patterned reticle. The reticle allows light from the light source to strike the photoresist only where the pattern is to be formed, thus exposing the resist corresponding to the pattern. The wafer is then immersed in an organic-based wash to develop and remove the exposed resist.

As integrated circuits have become more complex, they have also become smaller. To reproduce patterns that are smaller, optics having higher resolution are required. As resolution becomes more defined, there is a corresponding loss in depth of focus. Thus, a positive pattern process reaches a point where the photoresist is too thick to be fully developed all the way through to the base layer, leaving an incomplete pattern for further processing.

To overcome the problem of a loss of depth of focus for a gain of resolution, negative resist processes have been devised. One such negative resist method is diffusion-enhanced silylating resist (DESIRE). The DESIRE process uses a photoactive compound (PAC) which is mixed into the photoresist to form barriers to a reactive ion etch. The sections of the photoresist which are covered through the DESIRE process act as an etch stop, while the nonprotected areas may be etched to allow further processing.

The DESIRE process is advantageous because it does not suffer from the limitations of photo-optics. The DESIRE process does not require exposure of the photoresist beyond a depth of a few thousand Angstroms, therefore, high resolution optics with a low depth of focus produce acceptable patterns. However, the DESIRE process is a negative resist process, and is therefore subject to the limitations of a negative process. Such limitations include sensitivity to dirt particles on the reticle and the necessity to expose large surface areas. Thus, there is a need for a method and apparatus to provide a positive resist technique that does not suffer from limitations of photo-optics.

SUMMARY OF THE INVENTION

The present invention disclosed herein comprises a method and apparatus for positively patterning a surface-sensitive resist on a semiconductor wafer which eliminates or substantially reduces problems associated with prior photoresist methods. The present invention allows the patterning of photoresist using positive developing techniques without being subject to the limitations of photo-optics.

In accordance with one aspect of the present invention, an apparatus positively patterns a surface-sensitive resist on a semiconductor wafer. The apparatus comprises a deep ultraviolet light source, such as an excimer pulsed gas laser. The gas may comprise argon/fluoride or krypton/fluoride, which emit deep ultraviolet light at wavelengths of 193 nanometers and 248 nanometers, respectively. A reticle having the desired pattern in a positive format, which allows exposure of the resist in the pattern only, is positioned over the surface of the wafer to be patterned.

A phenol-containing resin is applied to the wafer surface, which is then exposed to light from the gas laser through the reticle. The deep ultraviolet light causes cross-linking of phenol molecules within the resin. A subsequent exposure of the entire wafer to hexamethyldisilazane (HMDS) allows the diffusion of silicon into the resist to form etch stops except for where the pattern has been cross-linked. The exposed region may then be oxygen reactive ion etched to form the pattern required for construction of the desired device.

It is a technical advantage of the present invention that positive photoresist techniques may be used without suffering from the limitations of photo-optics. A thick layer of photoresist may be applied to a device to compensate for topography changes without concern for a loss of resolution or depth of focus.

BRIEF DESCRIPTION OF THE DRAWINGS

For a more complete understanding of the present invention and for further advantages thereof, reference is now made to the following Detailed Description, taken in conjunction with the accompanying Drawings in which.

DETAILED DESCRIPTION OF THE INVENTION

Figure 1A:
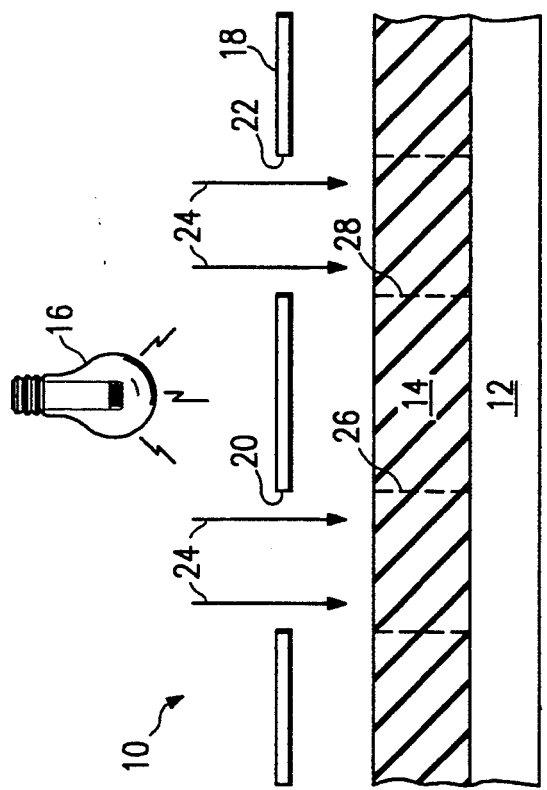
FIGS. 1a–b are cross-sectional views of a positive photoresist method in accordance with the prior art.

Referring to FIG. 1a, a cross-sectional view of a positive photolithographic process in accordance with the prior art is generally identified by the reference numeral 10. A silicon substrate 12 is coated with a layer of standard photoresist 14 which then exposed to light from a light source 16 through a reticle 18.

The reticle 18 has, for example, openings 20 and 22 therein corresponding to a desired pattern to be transferred to the photoresist 14. Light, as indicated by arrows 24, passes through the openings 20 and 22 in the reticle 18 and strikes the photoresist 14. The photoresist 14 is exposed by the light 24 to form exposed areas 26 and 28, corresponding to the reticle openings 20 and 22. The optics used (not shown) must have sufficient resolution to form the desired pattern as well as sufficient depth of focus to expose the photoresist 14 throughout its depth to the substrate 12.

Figure 1B:
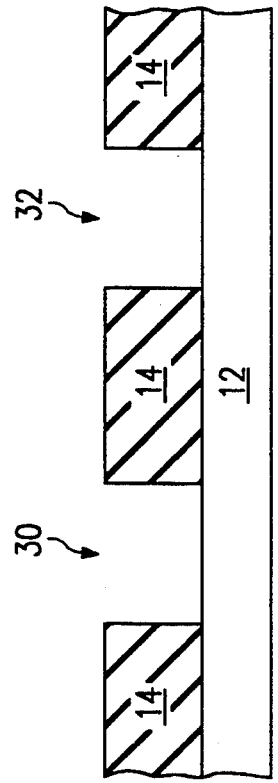

After exposing the photoresist 14, the substrate 12 is immersed in a wet chemical develop solution such as tetramethylammonium hydroxide (TMAH) or potassium hydroxide. The exposed areas 26 and 28 are thus developed and cleared of exposed photoresist, forming open areas 30 and 32 within the photoresist 14, as shown in FIG. 1b. The substrate 12 may then be etched or have deposits formed within the areas 30 and 32 as required.

The positive process 10 is relatively efficient until the photoresist thickness becomes greater than the depth of focus of the optics. In particular, whenever there is a non-planar substrate, the photoresist must be thicker to compensate for changes in topography. If very fine patterns are to be formed, the optics required would need a combination of high resolution and high depth of focus to obtain successful results with the positive process 10. Due to the inverse relationship between resolution and depth of focus, such results may become either impossible or too expensive to obtain.

Figure 2A:
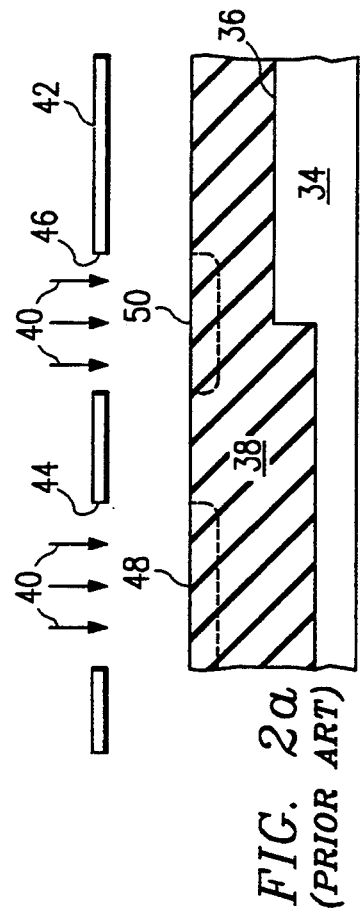
FIGS. 2a–c are cross-sectional views of a negative photoresist method in accordance with the prior art.

Referring to FIGS. 2a–d, cross-sectional views illustrating a diffusion-enhanced silylating resist process (DESIRE) in accordance with the prior art are shown. Referring first to FIG. 2a, a silicon substrate 34 has a stepped upper surface 36 formed by prior processing steps (not shown). The substrate 34 is covered with a layer of photoresist 38 comprising a heavily-dyed resin, which includes a photoactive compound (PAC), as is well known in the art. The resist 38 is heavily-dyed to absorb light, as indicated by arrows 40, and prevent penetration of the light 40 into the resist 38 beyond a depth of a few thousand Angstroms.

The resist 38 is exposed to the light 40 from a light source (not shown) through a reticle 42. The reticle 42 has openings 44 and 46 formed therein to correspond to areas in the photoresist 38 that are to remain in accordance with a negative photolithographic process. As the photoresist 38 is exposed to the light 40, exposed areas 48 and 50 are formed.

Figure 2B:
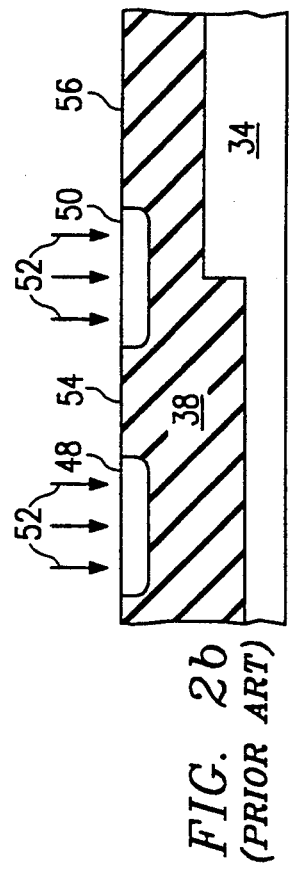

Referring to FIG. 2b, the photoresist 38 on the substrate 34 is then subjected to hexamethyldisilazane (HMDS), as indicated by arrows 52, in an oven (not shown). The PAC which is mixed into the photoresist 38 prevents diffusion of the HMDS 52 except where the PAC has been chemically altered by the light 40 in exposed areas 48 and 50. The HMDS 52 will thus diffuse into the exposed areas 48 and 50, allowing silicon (part of the HMDS 52) to bond to the resin within the resist 38. Likewise, the HMDS 52 will not diffuse into the resist 38 in areas 54 and 56 where no exposure to light 40 was allowed.

Figure 2C:
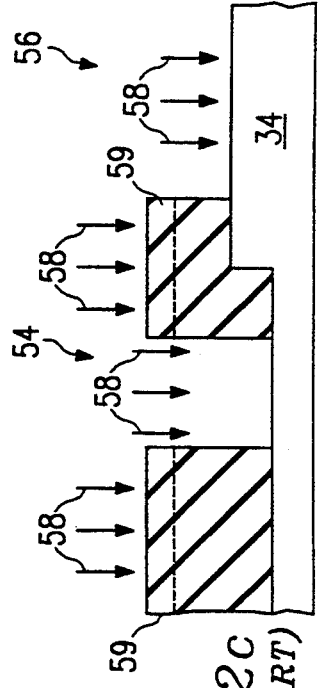

Referring to FIG. 2C, the substrate 34 is placed in an oxygen reactive ion etch reactor (not shown) to etch the resist 38 in unexposed areas 54 and 56. Oxygen, as indicated by arrows 58, which is used in the etch, combines with the bonded silicon in exposed areas 48 and 50 to form thereon silicon oxide layers 59. The silicon oxide layers 59 prevent the etching of the resist 38 in exposed areas 48 and 50. The reactive ion etch is conducted until all the resist is removed from unexposed areas 54 and 56 which are not protected by the formation of silicon oxide layers 59. An overetch is performed to insure that all the resist 38 is removed from unexposed areas 54 and 56. The silicon substrate 34 may then be further processed by deposition or etching as required.

The devices formed by the DESIRE method are not subject to limitations from a loss of depth of focus through increased resolution, since there is no requirement to penetrate the entire thickness of the photoresist. However, the negative photolithographic process is not particularly advantageous when attempting to form very fine metal-to-substrate contacts necessary for very small scale devices.

Another disadvantage to the negative process of DESIRE is the use of a PAC in the resin. PAC is very expensive and can add up to 30% to the cost of the photoresist. Also, the addition of a PAC to the resin in the photoresist tends to stiffen the photoresist, making a planarized surface more difficult to obtain.

Figure 3:
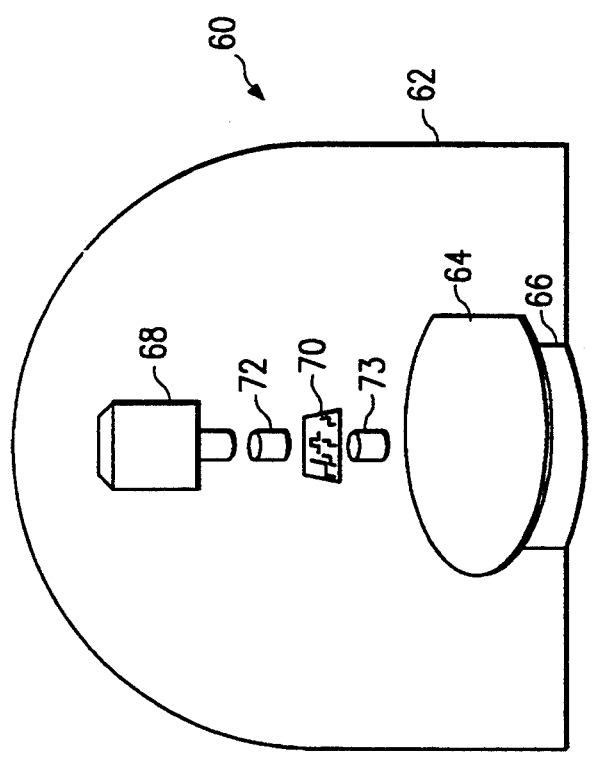
FIG. 3 is a perspective view of an apparatus constructed in accordance with the preferred embodiment of the present invention.

Referring to FIG. 3, a perspective view of an apparatus constructed in accordance with the present invention is generally identified by the reference numeral 60. The apparatus 60 comprises a container 62 for the photolithographic processing of a wafer 64. The wafer 64 is placed on a pedestal 66, which may comprise a heat chuck. It has been found through testing that the process in accordance with the present invention may be enhanced by the addition of heat to the wafer, as will be subsequently described in greater detail.

The wafer 64 is exposed to deep ultraviolet light, preferably having a wavelength between 190 and 320 nanometers, light from a light source 68 through a reticle 70. The light source 68 may comprise, for example, an excimer gas laser. The excimer gas laser may comprise an argon/fluoride laser emitting light at a wavelength of 193 nanometers or a krypton/fluoride laser emitting light at a wavelength of 248 nanometers.

Positioned between the light source 68 and the reticle 70 and between the reticle 70 and the substrate 64 are appropriate optical devices 72 and 73 to provide the proper resolution needed to form a pattern in the wafer 64. To process the wafer 64, the reticle 70 is patterned to provide a positive photolithographic pattern transfer, e.g. the wafer 64 is exposed to the light source 68 only where the substrate is to be revealed. The laser 68 is activated to emit light through the optical devices 72–73 and the reticle 70 onto the wafer 64. The wafer 64 is then processed in accordance with the present invention, as will be subsequently described in greater detail.

Figure 4A:
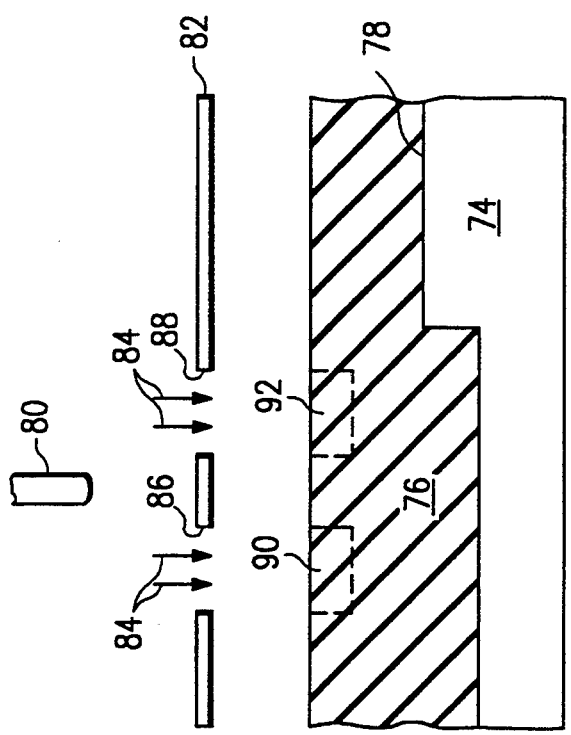
FIGS. 4a–c are cross-sectional views of a positive photoresist method in accordance with the present invention.
Figure 4B:
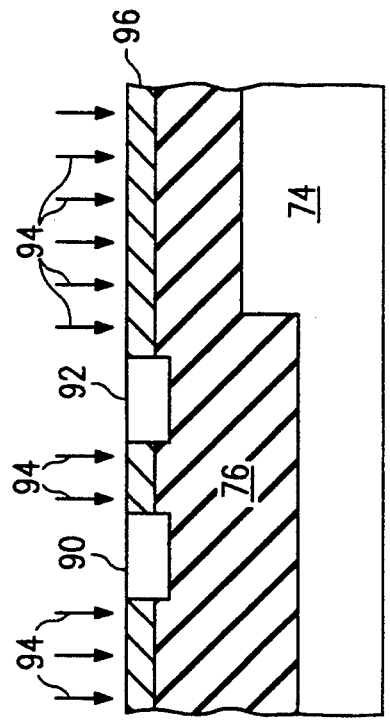
Figure 4C:
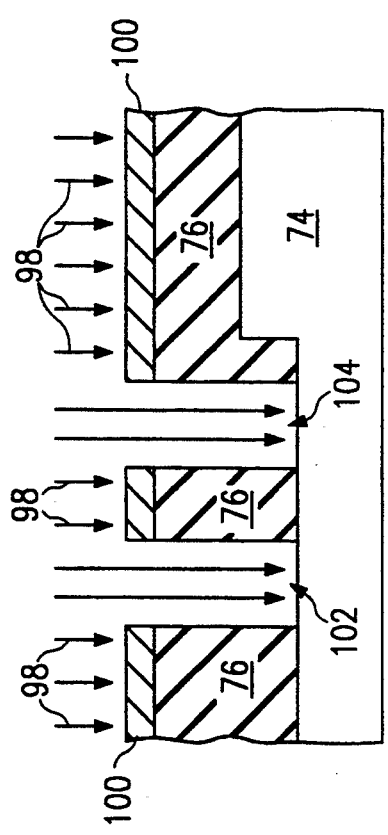

In FIGS. 4a–c, the process in accordance with the present invention is illustrated in cross-sectional views. Referring first to FIG. 4a, a silicon substrate 74 is coated with a photoresist 76. The photoresist 76 comprises a phenol-containing resin such as, for example, meta-, ortho- or para- cresol novolak. It is not necessary, as in accordance with the prior art, to add a photoactive compound (PAC) to the resin in the resist 76. Since PAC is expensive (adds approximately 30% to the cost of the photoresist), the present invention provides ample benefits through cost reduction alone. The substrate 74 may have a stepped surface 78 from previous processing.

The resist 76 is exposed to a light source 80 through a reticle 82 which is patterned for a positive photolithographic image. Ultraviolet light, as indicated by arrows 84, passes through openings 86 and 88 in the reticle 82 and strike the photoresist 76 to form thereon barrier areas 90 and 92. The barrier areas 90 and 92 correspond to a pattern to be formed on the substrate 74.

The barrier areas 90 and 92 are formed by a cross-link reaction resulting from the exposure of the phenol-containing resin in the photoresist 76 to the ultraviolet light 84. The cross-link reaction combines phenol molecules to create a more dense concentration of molecules which act as a barrier to prevent diffusion of HMDS into the resist 76.

If the substate 74 is heated, such as by a heat chuck, the cross-link reactions occur more rapidly, and the processing time is reduced. The preferred range of temperatures for heating the substrate 74 is 90° C. -140° C. with a target of 120° C. Temperatures beyond 140° C. may tend to initiate cross-link reactions even where the resist 76 is not exposed to light and should therefore be avoided.

Referring to FIG. 4b, the substrate 74 is processed in an oven (not shown) by exposure to HMDS, as indicated by arrows 94. Since the photoresist 76 does not contain a PAC, there is no barrier to diffusion of HMDS 94 except for where the cross-linked phenol formed the barrier areas 90 and 92. Thus, the HMDS 94 diffuses into and forms a silicon-bonded layer 96 over the photoresist 76 everywhere except for the barrier areas 90 and 92.

Referring to FIG. 4c, the substrate 74 is placed in an oxygen reactive ion etch reactor (not shown). Oxygen, as indicated by arrows 98, combines with the silicon in the silicon-bonded layer 96 to form a silicon-oxide layer 100 which acts as an etch stop to prevent etching of the resist 76 thereunder. In barrier areas 90 and 92, where no silicon is bonded to the resist 76, the etch is free to remove the crosslinked barriers 90 and 92 and the resist 76 and form recesses 102 and 104. The substrate 74 in the recesses 102 and 104 may then be processed by either etching or depositing a material thereon, as desired.

The method in accordance with the present invention thus forms a pattern in photoresist over the surface of a semiconductor substrate using the advantages of a positive image system and avoiding the limitations of optical devices. The present invention also reduces the photolithographic cost in comparison to the DESIRE process by eliminating the need for a PAC additive and by using the inherent qualities of the photoresist.

Although the present invention has been described with respect to a specific, preferred embodiment thereof, various changes and modifications may be suggested to one skilled in the art, and it is intended that the present invention encompass such changes and modifications as fall within the scope of the appended claims.

What is claimed is:

1. A method for positively imaging a surface-sensitive photoresist, comprising the steps of:

formulating a photoresist composition consisting essentially of a phenol-containing resin containing no additional photoactive compound;

coating a semiconductor surface of a workpiece with the photoresist composition to form a photoresist layer;

superimposing a positive image reticle over said photoresist layer;

selectively exposing said photoresist layer to deep ultraviolet light through said positive image reticle to crosslink phenol molecules within said photoresist layer to form a positive image;

during said step of exposing said photoresist layer to ultraviolet light, selectively heating said photoresist layer to a temperature within the range of 90° C. to 140° C. to increase the crosslink reaction rate of phenol molecules within said photoresist layer;

introducing a gaseous hexamethyldisilazane capable of permeating noncrosslinked regions of said photoresist layer into a chamber containing the workpiece;

forming silicon bonds with the gaseous hexamethyldisilazane and said resin except in said exposed areas; and removing said photoresist layer from said exposed areas to form a positive image in said photoresist layer on said semiconductor surface.

2. The method of claim 1, wherein the step of exposing comprises exposing said resin to a pulsed gas laser.

3. The method of claim 1, wherein the step of forming silicon bonds comprises diffusing said gaseous hexamethyldisilazane into said photoresist layer in an oven.

4. The method of claim 1, wherein the step of removing comprises etching said exposed areas in an oxygen reactive ion etch reactor.

* * * * *